(12) United States Patent
Hamada

(10) Patent No.: US 6,221,760 B1
(45) Date of Patent: Apr. 24, 2001

(54) SEMICONDUCTOR DEVICE HAVING A SILICIDE STRUCTURE

(75) Inventor: Koji Hamada, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 08/954,427

(22) Filed: Oct. 20, 1997

(51) Int. Cl.$^7$ .................. H01L 21/4763; H01L 23/48; H01L 23/52

(52) U.S. Cl. ............... 438/630; 438/624; 438/637; 438/656; 438/658; 438/663; 438/664; 438/672; 438/675; 438/682; 438/683; 257/741; 257/748; 257/750; 257/754; 257/755; 257/757; 257/758; 257/760; 257/763

(58) Field of Search .......................... 257/377, 382, 257/383, 384, 389; 438/533, 314, 664; 338/309; 357/30, 34; 427/57

(56) References Cited

U.S. PATENT DOCUMENTS

| | | | | |
|---|---|---|---|---|
| 4,001,762 | * | 1/1977 | Aoki et al. ............................ | 338/309 |
| 4,332,837 | * | 6/1982 | Peyre-Lavigne ....................... | 427/57 |
| 4,454,526 | * | 6/1984 | Nishizawa et al. .................... | 357/30 |
| 4,717,681 | * | 1/1988 | Curran ................................ | 438/314 |
| 4,800,415 | * | 1/1989 | Simmons et al. ...................... | 357/34 |
| 5,369,055 | * | 11/1994 | Chung ................................. | 438/533 |

FOREIGN PATENT DOCUMENTS

| | | | | |
|---|---|---|---|---|
| 55-13426 | * | 4/1980 | (JP) ............................... | H01L/27/04 |
| 59-105362 | * | 6/1984 | (JP) ............................... | H01L/29/72 |
| 4-82220 | * | 3/1992 | (JP) ............................... | H01L/21/88 |
| 10-125621 | * | 5/1998 | (JP) ............................... | H01L/21/28 |

OTHER PUBLICATIONS

S.M. Sze, "Physics of Semiconductor Devices", 2nd edition, John Wiley & Sons, Central Book Company, Taipei, Taiwan, 1983.*
English Translation of Sumi's Japanese Patent Publication No. JP 04–82220, Mar. 16, 1992.*
S. Wolf and R.N. Tauber, Silicon Processing for the VLSI Era, vol. 1, p. 195, Lattice Press, Sunset Beach, CA, USA, 1986.*
"Elevated Silicide Source/Drain (ESSOD) by Load–Lock LPCVD–SI and Advance Silicidation Processing" Kotaki et al IEEE; 1993; pp. 839–842.
"High Transcoductance 0.1 μm pMOSFET" Tauer et al; IEDM Technical Digest; 1992; pp. 901–904.

* cited by examiner

Primary Examiner—Sara Crane
Assistant Examiner—Bernard E. Souw
(74) Attorney, Agent, or Firm—Hayes, Soloway, Hennessey, Grossman & Hage, P.C.

(57) ABSTRACT

A semiconductor device has a thin semi-insulating polycrystalline silicon (SIPOS) film on the surface of a silicon substrate having a diffused region therein. The SIPOS film is thermally treated at the bottom of a via-plug of an overlying metallic film to form a metallic silicide for electrically connecting the via-plug with the diffused region, whereas the SIPOS film is maintained as it is for insulation on a dielectric film. The SIPOS film protects the diffused regions against over-etching to thereby improve the junction characteristics and provide a larger process margin for contacts between the metallic interconnects and the diffused regions.

6 Claims, 4 Drawing Sheets

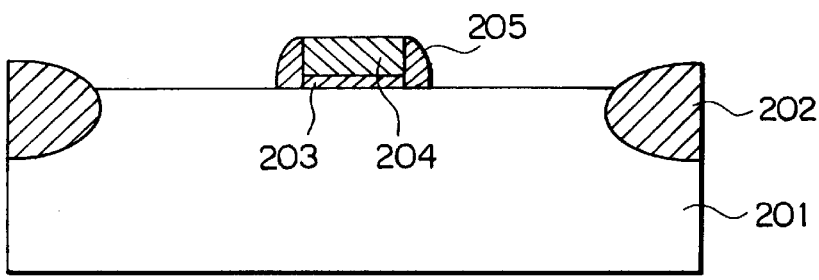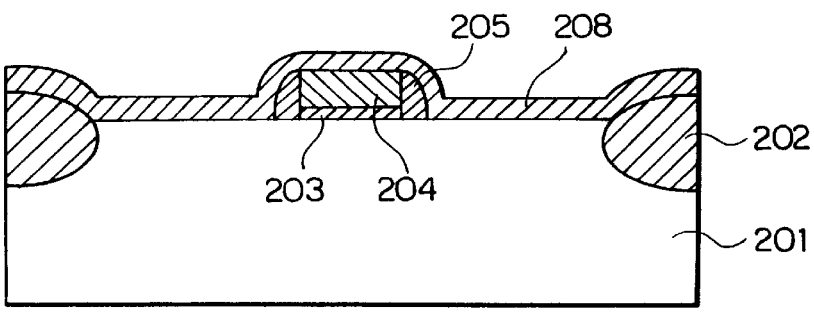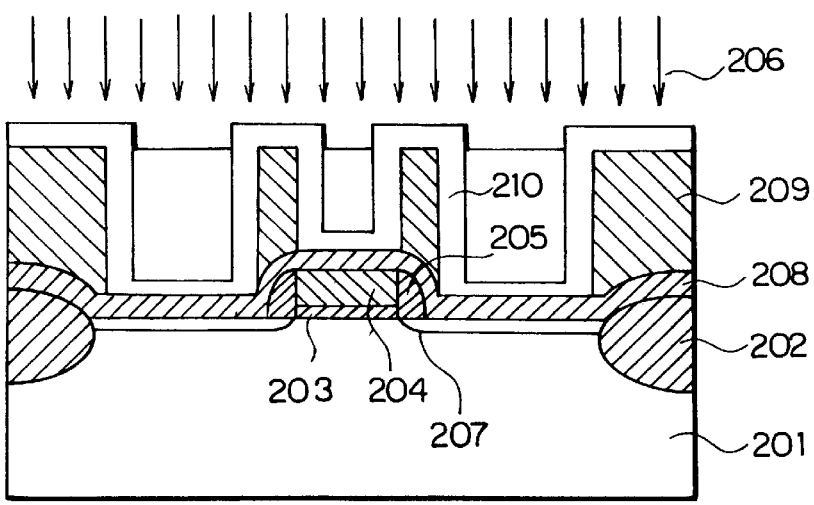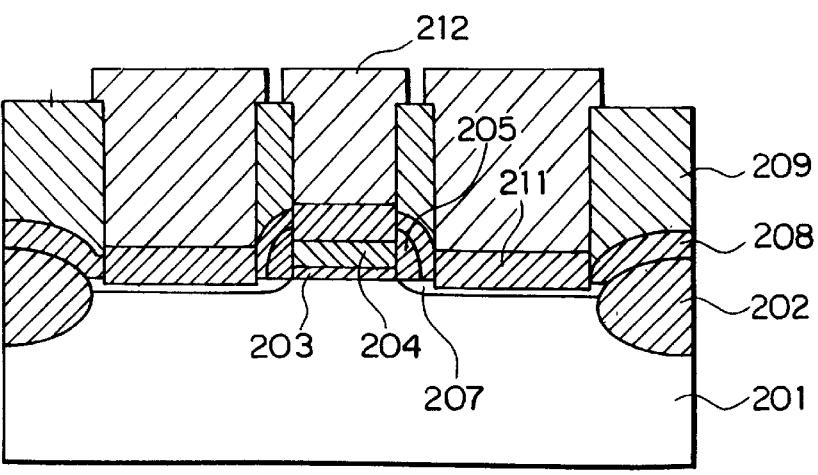

SEMICONDUCTOR DEVICE HAVING A SILICIDE STRUCTURE

BACKGROUND OF THE INVENTION (a) Field of the Invention

The present invention relates to a semiconductor device having a silicide structure and, more particularly to an improved silicide structure using a semi-insulating polycrystalline silicon film. The present invention also relates to a method for manufacturing the same.

(b) Description of the Related Art

Recently, a shallow junction structure is a key technology in a diffused region of small sized and high density semiconductor devices. In the shallow junction structure, some problems are reported in connection with the contacts between diffused regions and overlying metallic interconnects.

FIGS. 1A to 1D show a semiconductor device in consecutive fabrication steps thereof, which is proposed for solving the above mentioned problems by Y. Taur, S. Cohen, S. Wind et al., in "International Electron Device Meeting Technical Digest (IEDM)", pp901, 1192.

In FIG. 1A, a field oxide film 302 is formed on a silicon substrate 301, followed by formation of an oxide film and a polycrystalline silicon (polysilicon) film. After an electron beam (EB) exposure, a reactive ion etching using a HBr/$Cl_2$ etching gas is conducted at a high selectivity between the silicon substrate and the silicon oxide film to form a gate structure including a gate oxide film 303 and a gate polysilicon film 304, thereby obtaining 0.1 micron-order gate length for a MOSFET.

Subsequently, Sb ions are introduced to the surface portions of the silicon substrate to make the surface portions of the silicon substrate 301 amorphous, followed by ion-implantation with $BF_2$ ions 316 having a low acceleration energy, and forming p+ extensions 317 having a depth as low as 50 to 70 nanometers (nm), as shown in FIG. 1A. The p+ extension 317 functions for alleviating difficulties in forming contacts between the diffused regions and overlying metallic interconnects as well as reducing the contact resistance therebetween.

Thereafter, as shown in FIG. 1B, an oxide film is deposited, followed by etch-back thereof to form a side-wall 305. A selective ion-implantation of silicon surface with impurity ions 318 is then effected to form source/drain regions 319 having a depth larger than the depth of the p+ extensions 317. A blanket Ti film 310 is then deposited on the entire surface by sputtering, as shown in FIG. 1C.

Thereafter, a sintering is conducted to form a TiSi film 311 at the interface between the source/drain region 319 and the Ti film 310. An interlayer dielectric film 309 is then deposited, followed by dry-etching thereof to form via-holes (through-holes). Sputtering and subsequent etching of AlSiCu, for example, provide metallic interconnects 312 in the semiconductor device, as shown in FIG. 1D.

In the proposed process, the shallow p+ extensions 317 enables fabrication of 0.1-micron order small-sized transistors with an enough process margin for the contacts between the heavily doped regions 319 and the metallic interconnects 312.

However, there is a possibility that the doped impurity ions diffuse in the lateral direction as well as the vertical direction during the thermal treatment for activation of the impurity ions in the heavily doped source/drain regions 319. The lateral diffusion generally demands a large thickness of the side-wall 305 in the gate structure for assuring the presence of the shallow p+ extensions 317, which hinders a smaller gate length in the gate structure. Moreover, the silicide structure employed for reducing the resistance of the diffused regions 319 and metallic interconnects 312 tends to cause a leakage current flowing between the gate electrode and the source/drain regions due to an inaccurate positioning of etching or diffusion.

FIGS. 2A to 2D show, similarly to FIGS. 1A to 1B, a second conventional fabrication process, proposed by H. Kotaki, M. Nakano, Y. Takegawa et al. in "International Electron Device Meeting Technical Digest (IEDM)", pp839, 1993. A field oxide film 402 is formed on a silicon substrate 401, followed by formation of gate oxide film 403, gate polysilicon film 404 and side-wall 405. The resultant wafer is introduced into a Load-Lock chamber of a LPCVD equipment, wherein $N_2$ gas having a dew point of $-100°$ C. flows, while controlling the equipment so that a native oxide film or water molecules are not attached to the surface of the wafer.

A Si film 420 is then deposited thereon by using a $SiH_4$ gas at a substrate temperature of $620°$ C., as shown in FIG. 2A. In this step, a Si epitaxial layer is formed on the surface of the silicon substrate 401 due to the clean surface thereof, whereas a polysilicon film is formed on the oxide films 402 and 405.

A selective etching for the polysilicon film by using an etchant containing $HNO_3$ and $CH_3COOH$ leaves the elevated Si epitaxial layer 421 formed on the surface of the silicon substrate 401, as shown in FIG. 2B. An ion-implantation with impurity ions 418 and subsequent activation heat treatment are then conducted to provide a shallow diffused layer 422, followed by sputtering to form a Ti film 410 thereon, as shown in FIG. 2C.

A TiSi film 411 is then selectively formed on the surface of the Si epitaxial layer 421, followed by deposition of a blanket interlayer dielectric film 409 and subsequent selective dry-etching thereof to form via-holes. Then, sputtering and subsequent patterning of a metal such as AlSiCu is effected to form metallic interconnects 412 having via-plugs formed in the via-holes, as shown in FIG. 2D.

In the second conventional process as described above, the elevated Si epitaxial source/drain regions 421 provide advantages of suppression of the transistor short-channel effect in the shallow source/drain regions, reduction of resistance in the diffused regions and via-plugs due to the metallic silicide layer, and a larger process margin between the heavily doped source/drain regions and the metallic interconnects.

In a small-sized semiconductor device formed by the second conventional technique, the epitaxial step for the elevated epitaxial source/drain regions involves contamination at the interface between the elevated epitaxial regions and Si substrate in a small-sized semiconductor device formed on a larger wafer, which requests a surface treatment at the interface between the epitaxial layer and the silicon substrate during the growth step. The second conventional process also requests a high selectivity between the poly-silicon film and the monocrystalline silicon substrate, which is difficult to achieve in mass production.

SUMMARY OF THE INVENTION

It is therefore an object of the present invention to provide a semiconductor device having shallow diffused regions, low contact resistance between the shallow diffused regions and metallic interconnects, and capable of allowing a sufficient process margin between the diffused regions and the metallic interconnects in the fabrication process.

It is another object of the present invention to provide a method for fabricating such a semiconductor device.

The present invention provides a semiconductor device comprising a semiconductor substrate, a first dielectric film formed on the semiconductor substrate, a diffused region formed in a surface region of the semiconductor substrate, a semi-insulating polycrystalline silicon (SIPOS) film formed at least on the diffused region and the first dielectric film, a second dielectric film formed on the SIPOS film and having a via-hole above the diffused region, and a metallic film formed on the second dielectric film and having a via-plug filling the via-hole, the SIPOS film forming at a bottom of the via-plug a metallic silicide made from the metallic film and SIPOS film for electrically connecting the via-plug and the diffused region.

The present invention also provides a method for manufacturing a semiconductor device comprising the steps of forming a diffused region in a surface region of a semiconductor substrate, forming a first dielectric film on the semiconductor substrate in a region other than the diffused region, depositing a semi-insulating polycrystalline (SIPOS) film at least on the diffused region and the first dielectric film, forming a second dielectric film on the SIPOS film, patterning the dielectric film to form a via-hole on the SIPOS film above the diffused region, depositing a metallic film on the second dielectric film and in the via-hole, forming a metallic silicide from the metallic film and the SIPOS film for electrically connecting the metallic film and the diffused region.

In accordance with the semiconductor device according to the present invention or formed by a method according to the present invention, the SIPOS film having an inherent high resistivity functions as a dielectric film at specific portions and functions as a low resistive contact at the portion where the SIPOS film is silicidated. The SIPOS film having such functions can be formed by a process substantially without causing deterioration of the characteristics of the heavily doped regions and with a sufficient process margin between the metallic interconnects and the heavily doped regions.

The SIPOS film generally contains oxygen at several percents to several tens of percents, assumes a semi-insulating characteristic having an inherent resistivity of around $10^8$ Ω-cm, and has a sheet resistance of around 80 Ω/square after the silicidation thereof.

The above and other objects, features and advantages of the present invention will be more apparent from the following description, referring to the accompanying drawings.

BRIEF DESCRIPTION OF THE DRAWINGS

FIGS. 4A to 4D are cross-sectional views of a semiconductor device according to a second embodiment of the present invention in consecutive steps of the fabrication process therefor.

PREFERRED EMBODIMENT OF THE INVENTION

Figure 1A:
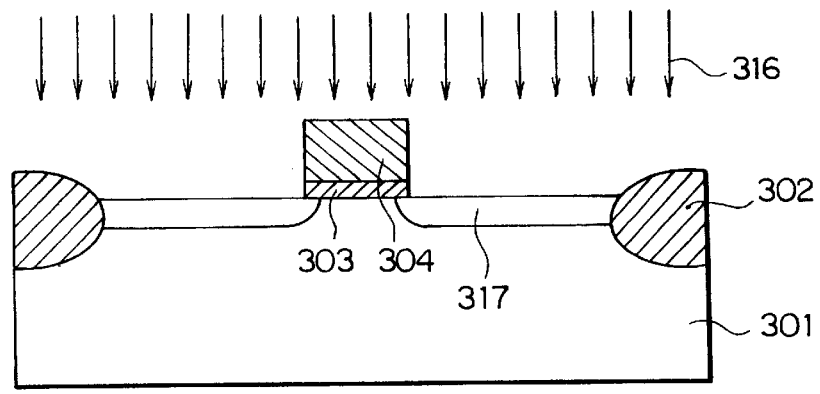
FIGS. 1A to 1D are cross-sectional views of a first conventional semiconductor device in consecutive steps of the fabrication process therefor.
Figure 1B:
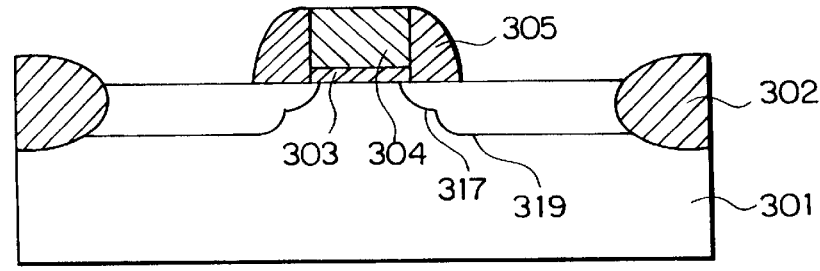
Figure 1C:
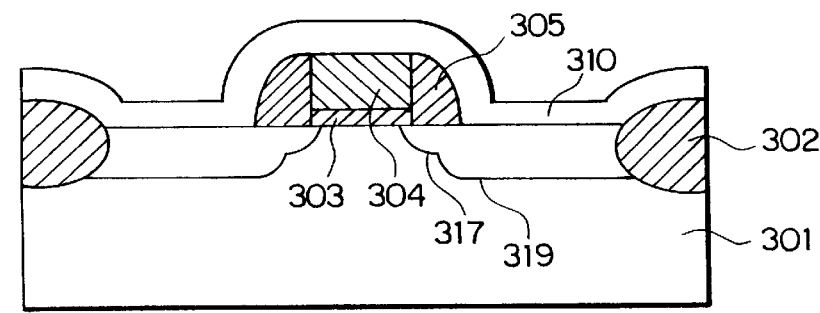
Figure 1D:
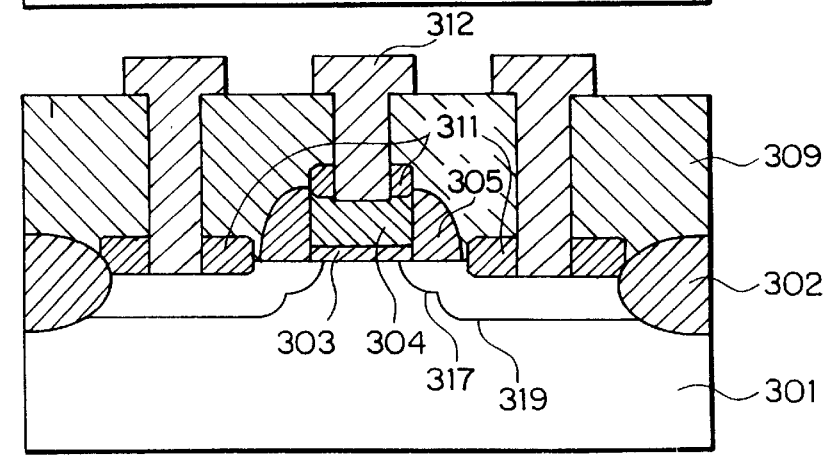
Figure 2A:
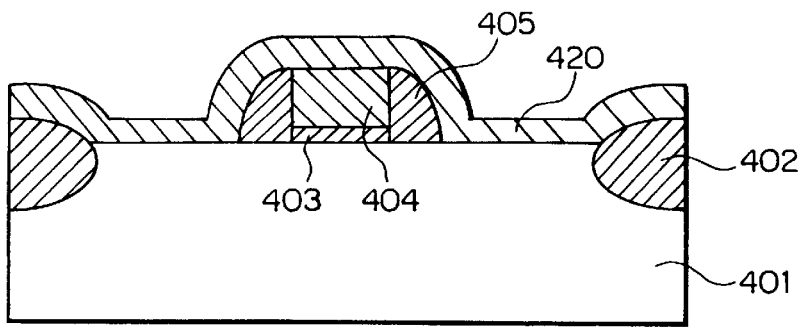
FIGS. 2A to 2D are cross-sectional views of a second conventional semiconductor device in consecutive steps of the fabrication process therefor.
Figure 2B:
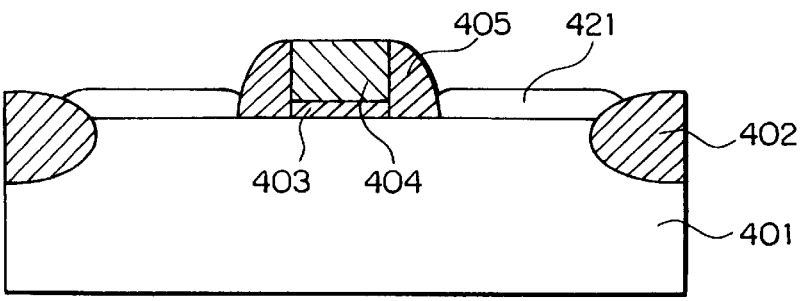
Figure 2C:
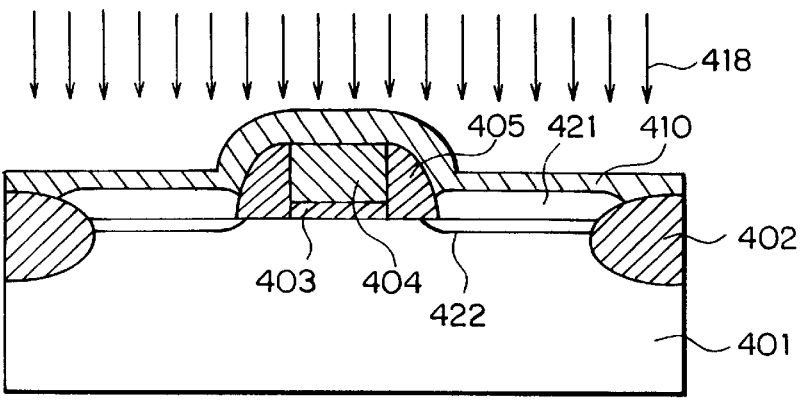
Figure 2D:
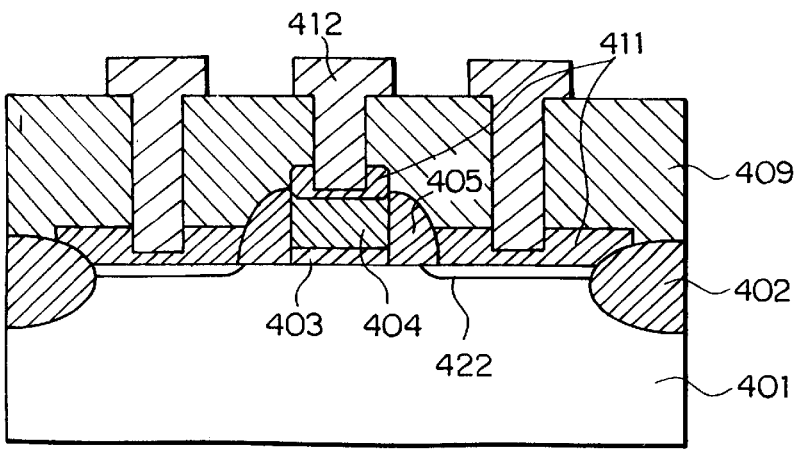

Now, the present invention is more specifically described with reference to accompanying drawings.

Referring to FIGS. 3A to 3D, a basic structure of the semiconductor device according to a first embodiment will be described by way of the fabrication process thereof. A field oxide film 102 is formed on a monocrystalline silicon substrate 101, followed by forming a thin oxide film and a polysilicon film and subsequent patterning thereof by a dry-etching process to form a gate structure including a gate oxide film 103 and a polysilicon gate electrode 104. The thicknesses of the gate oxide film 103 and gate electrode 104 are 5 nm and 250 nm, respectively.

Figure 3A:
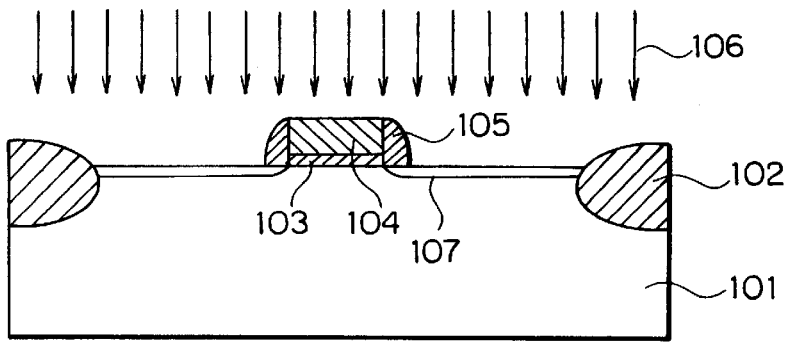
FIGS. 3A to 3D are cross-sectional views of a semiconductor device according to a first embodiment of the present invention in consecutive steps of the fabrication process therefor.

Thereafter, silicon oxide ($SiO_2$) is deposited to a thickness of 35 nm by a CVD process and etched-back by dry-etching to form a 35-nm-thick side-wall 105 on both sides of the gate structure, as shown in FIG. 3A. The dry-etching of the silicon oxide film is effected to achieve a high selectivity between the silicon substrate 101 and the silicon oxide film 105.

Figure 3B:
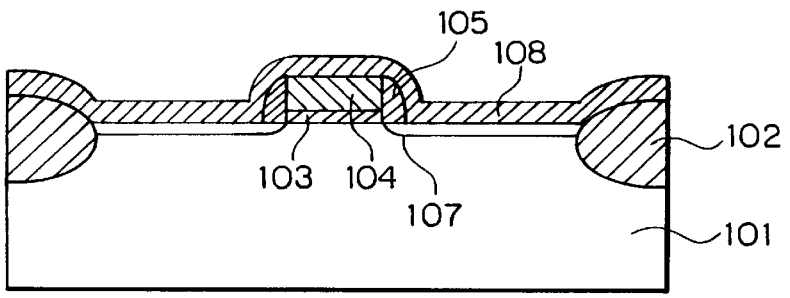

Subsequently, shallow source/drain diffused regions 107 are formed by ion-implantation, followed by deposition of a thin semi-insulating polysilicon (SIPOS) film 108, as shown in FIG. 3B. The ion-implanting step is effected first by Ge ions having an acceleration energy of 10 to 30 KeV at a dosage of 0.5 to $5.0 \times 10^{15}/cm^2$ to form an amorphous surface of the silicon substrate, and then by B ions having an acceleration energy of 1 to 5 KeV at a dosage of 0.5 to $5 \times 10^{15}/cm^2$. The implantation of Ge ions functions for suppressing the channeling of the B ions. Then, rapid thermal annealing (RTP) follows to thermally activate the introduced ions in the diffused regions 107, thereby forming shallow p+ diffused regions having a p-n junction thickness below 60 nm.

The resultant wafer is introduced to a low-pressure chemical vapor deposition (LPCVD) chamber, wherein $SiH_4/N_2O$ gas is introduced as a source gas, to deposit a SIPOS film 108 thereon to a thickness of 50 nm at a substrate temperature of 650° C.

Subsequently, an interlayer dielectric film 109 is deposited by a CVD process to a thickness of 500 nm and subjected to selective etching for patterning to form via-holes therein. In the patterning, it is generally preferable to use a relatively high selectivity between the silicon oxide film and the silicon substrate. However, a slight over-etching may be preferably employed, to obtain complete via-holes exposing the silicon surface even in the case of a larger diameter of the wafer and a larger variation of the thickness of the interlayer dielectric film.

Figure 3C:
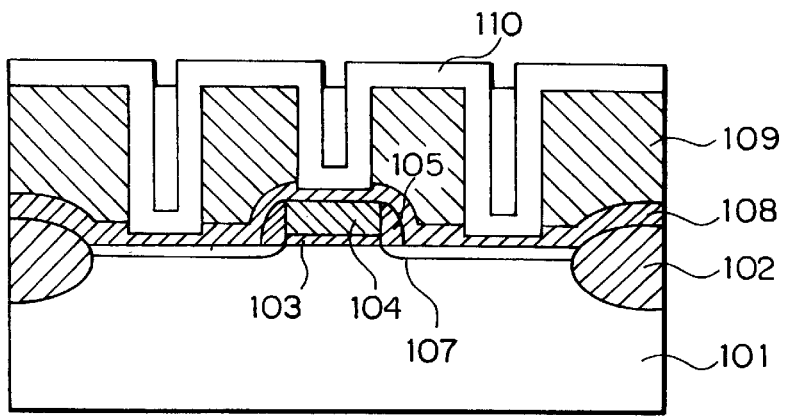

The over-etching may be such that the SIPOS film 108 is etched by 5 to 20 nanometers (nm) in the thickness thereof, as shown in FIG. 3C. If such an over-etching is employed in the conventional device, damages or crystal defects are generally caused in the silicon substrate. On the other hand, in the present embodiment, the blanket SIPOS film 108 interposed between the interlayer dielectric film 109 and the silicon substrate 101 is subjected to the over-etching at the diffused regions 107 to prevent the over-etching of the silicon substrate 101 itself, thereby protecting the silicon substrate 101 against the damages due to the dry-etching.

Figure 3D:
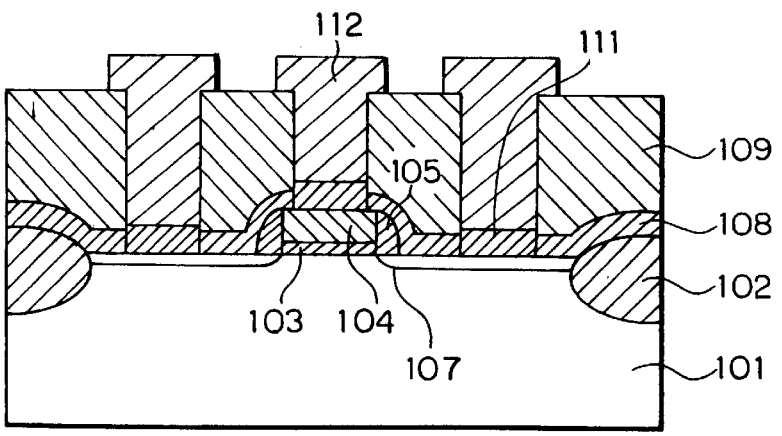

Subsequently, ion-implanting using B ions having an acceleration energy of 2 to 5 KeV is effected at a dosage of 1 to $5 \times 10^{15}/cm^2$, followed by deposition of a metallic Ti film 110 to a thickness of 30 nm by sputtering. The Ti film 110 enables an excellent contact between an overlying metallic interconnects and the silicon substrate 101. The Ti film 110 is then subjected to silicidation sintering by a RTA process at temperatures around 690° C. and 890° C., and subsequent etching of excess metal of Ti. After these steps, the SIPOS film 108 is silicidated at the bottoms of the via-holes to form a silicide films 111 in the entire thickness, or from the top surface to the bottom surface thereof. These steps provide a sheet resistance of about 80 Ω/square of the silicide film 111, thereby reducing the resistance of the surface of the diffused regions without causing damages in the silicon substrate, erosion of the shallow diffused region by the silicide film 111 and deterioration of the junction characteristics. Thereafter, metallic interconnects 112 are formed thereon to provide a basic structure of the present embodiment, as shown in FIG. 3D, wherein an excellent low resistance of the contacts is obtained between the metallic interconnects 112 and source/drain diffused regions 107.

In the present embodiment, the leakage current between the gate electrode 104 and source/drain diffused regions 107 due to the metallic silicide structure can be prevented. This is because the SIPOS film 108 functions substantially as an insulator because of the inherent resistivity thereof in the lateral direction as high as around $10^8$ $\Omega$m, because over-etching of the silicon substrate is prevented, and because a large process margin can be obtained for the contacts between the metallic interconnects and the diffused regions.

In the structure as described above, a thick side-wall or deep source/drain regions are no longer necessary for reduction of the leakage current in the present embodiment. Thus, the present embodiment achieves shallow junctions, low contact resistance between the heavily doped regions and the metallic interconnects, without involving complicated and unstable fabrication steps including silicon epitaxial growth while surface-treating the interface between the grown layer and the silicon substrate and selective etching of the grown polysilicon film on the oxide film.

A semiconductor device according to a second embodiment of the present invention is formed by the fabrication steps shown in FIGS. 4A to 4D. A field oxide film 202 is formed on a monocrystalline silicon substrate 201, followed by formation of a 5-nm-thick oxide film and a 250-nm-thick polysilicon film and a subsequent patterning thereof to form a gate structure including a gate oxide film 203 and a gate electrode 204. Subsequently, a blanket 20-nm-thick silicon nitride (SiN) film is deposited by a CVD process and etched-back to form a side-wall on both side walls of the gate structure, as shown in FIG. 4A.

Thereafter, a 50-nm-thick SIPOS film 208 is deposited at a substrate temperature of 650° C., as shown in FIG. 4B, followed by deposition of a 500-nm-thick interlayer dielectric film 209 by CVD and subsequent patterning thereof to form via-holes therein. In the present embodiment, the size of the diffused regions is comparable to the size of the via-holes, and accordingly, the edge of the via-holes is substantially defined by the surface of the side-wall 205, as shown in FIG. 4C. It is preferable that a high selectivity between the silicon substrate 201 and silicon oxide film 209 be employed in the patterning. In the present embodiment, the etching for the via-holes is stopped at the surface of the SIPOS film 208, and the oxide film remaining on the surface of the SIPOS film 208 is subjected to an additional spin-etching removal to completely expose the SIPOS film 208 in the via-holes.

A shallow source/drain regions 207, having a junction depth below 40 nm as viewed from the interface between the gate oxide film 203 and the silicon substrate 201, are then formed by ion-implantation. In this step, $BF_2$ ions having an acceleration energy of 10 KeV are introduced to the SIPOS film 208 at a dosage of $3\times10^{15}/cm^2$, and subjected to a RTA step for thermal activation and solid phase diffusion of B to form the shallow diffused regions 207.

Subsequently, a blanket Ti film 210 is deposited by sputtering, and subjected to silicidation sintering by RTA at temperatures of 690° C. and 890° C. to form a silicide film and subsequent etching to remove excess metal of Ti. By these steps, the portions of the SIPOS film 208 each having a surface exposed by the via-hole and extending from the top to the bottom thereof are silicidated to form silicide films 211. In this step, the corresponding surface portions of the silicon substrate 201 in a thickness around 10 nm is also silicidated on the diffused regions 207, which can be accepted, however, so long as the diffused regions 207 are not deteriorated. The silicide SIPOS film 211 has a sheet resistance as low as around 80 $\Omega$/square, or about 60 to 100 $\Omega$/square to reduce the resistance of the surface of the diffused regions, without causing damages to the silicon substrate, penetration of via-holes to the shallow diffused regions due to the erosion by the silicide film, or deterioration of the junction characteristics. Metallic interconnects 212 are then formed to achieve a basic structure of the present embodiment, as shown in FIG. 4D. The present embodiment has advantages similar to those achieved by the first embodiment.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising the steps in sequence of:

(A) forming a gate structure having exposed side walls including a gate oxide film and a polysilicon gate electrode on a surface of a semiconductor substrate;

(B) forming a diffused region in a surface region of said semiconductor substrate other than under said gate structure;

(C) forming a first dielectric film on the exposed side walls of said gate structure;

(D) depositing a semi-insulating polycrystalline (SIPOS) film at least on said diffused region and said first dielectric film;

(E) forming a second dielectric film on said SIPOS film;

(F) patterning said second dielectric film by etching to form a via-hole through said second dielectric film and into a surface portion of said SIPOS film directly over said diffused region, whereby to form a via-hole having a diameter no greater than that of said diffused region; and (G) depositing a metallic film on said second dielectric film and in said via-hole, forming, only at the bottom of said via-hole, a metallic silicide from said metallic film and said SIPOS film for electrically connecting said metallic film and said diffused region in the vertical direction, said SIPOS film functioning as an insulator in the lateral direction.

2. A method for manufacturing a semiconductor device as defined in claim 1, wherein said gate structure is formed by dry etch patterning a gate oxide film on a polysilicon film on said semiconductor substrate.

3. A method for manufacturing a semiconductor device as defined in claim 1, wherein said diffused region is formed by ion implantation followed by rapid thermal annealing.

4. A method for manufacturing a semiconductor device as defined in claim 1, wherein said patterning step comprises an over etching of a surface portion of said SIPOS film.

5. A method for manufacturing a semiconductor device as defined in claim 1, wherein said metallic silicide forming step leaves said SIPOS film substantially as it is on said first dielectric film.

6. A method for manufacturing a semiconductor device as defined in claim 1, wherein said SIPOS film depositing step uses $SiH_4$ and $N_2O$ as a source gas.

* * * * *